United States Patent
Kim

(10) Patent No.: US 11,650,258 B2
(45) Date of Patent: May 16, 2023

(54) SYSTEM FOR IDENTIFYING CONTROLLER CAUSING ELECTRICAL DISCHARGE OF VEHICLE

(71) Applicants: Hyundai Motor Company, Seoul (KR); Kia Corporation, Seoul (KR)

(72) Inventor: Dong Hwan Kim, Yongin-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 16 days.

(21) Appl. No.: 17/392,509

(22) Filed: Aug. 3, 2021

(65) Prior Publication Data

US 2022/0170991 A1    Jun. 2, 2022

(30) Foreign Application Priority Data

Dec. 2, 2020 (KR) .................. 10-2020-0166556

(51) Int. Cl.
  *G01R 31/3842* (2019.01)
  *B60R 16/023* (2006.01)
  *H04L 67/12* (2022.01)
  *B60R 16/033* (2006.01)

(52) U.S. Cl.
  CPC ...... *G01R 31/3842* (2019.01); *B60R 16/0231* (2013.01); *B60R 16/033* (2013.01); *H04L 67/12* (2013.01)

(58) Field of Classification Search
  CPC ............ G01R 31/3842; B60R 16/0231; B60R 16/033; H04L 67/12
  USPC ......................................................... 307/10.1
  See application file for complete search history.

(56) References Cited

U.S. PATENT DOCUMENTS

| | | | |
|---|---|---|---|
| 6,389,030 B1 * | 5/2002 | Coden | H04L 49/102 709/251 |
| 9,390,569 B2 * | 7/2016 | Kurnik | G07C 5/085 |
| 2008/0198909 A1 * | 8/2008 | Tsatsanis | H04L 25/03343 375/350 |
| 2013/0318380 A1 * | 11/2013 | Behrens | H04L 12/40039 713/323 |
| 2017/0337316 A1 * | 11/2017 | Zhao | H04W 88/08 |
| 2019/0341803 A1 * | 11/2019 | Cook | H02J 9/061 |

* cited by examiner

*Primary Examiner* — Michael R. Fin
(74) *Attorney, Agent, or Firm* — Slater Matsil, LLP

(57) ABSTRACT

An embodiment system for identifying a controller causing an electrical discharge of a vehicle includes a signal delay unit communicatively connected to controllers within the vehicle and configured to transmit a wake-up trigger signal after a predetermined first time passes when the wake-up trigger signal is input from a first controller among the controllers, and a microcontroller unit configured to enter into a wake-up mode after the first time passes when the microcontroller unit is in a sleep mode and the wake-up trigger signal is received through a single-channel transceiver connected to the first controller and store an identification of the first controller when the wake-up trigger signal is received from the signal delay unit.

20 Claims, 7 Drawing Sheets

SYSTEM FOR IDENTIFYING CONTROLLER CAUSING ELECTRICAL DISCHARGE OF VEHICLE

CROSS-REFERENCE TO RELATED APPLICATIONS

This application claims the benefit of Korean Patent Application No. 10-2020-0166556, filed Dec. 2, 2020, which application is hereby incorporated herein by reference.

TECHNICAL FIELD

The present disclosure relates to a system for identifying a controller causing an electrical discharge of a vehicle.

BACKGROUND

Recently, various electronic control systems have been installed in vehicles, and accordingly, numerous controllers have been used. These numerous controllers in a vehicle provide convenience to a user, but may cause a dark current after the ignition of the vehicle is turned off, thereby causing an electrical discharge of the vehicle.

However, finding the controller causing the dark current (i.e., the controller that is not entering into a sleep mode) has many physical limitations.

In addition, even in a situation where all communications of controllers within a vehicle are normally terminated and the entire vehicle communication network enters into the sleep mode, there is a possibility that the vehicle communication network may be switched to an alive state by an arbitrary controller among the controllers within the vehicle.

More specifically, after all of the controllers within the vehicle enter into the sleep mode and the vehicle communication network is terminated, an arbitrary controller among the controllers within the vehicle may be woken up and may be switched to the alive state due to abnormal operations. When the arbitrary controller is woken up due to the abnormal operations, the vehicle communication network is turned to the alive state again, but it is impossible to confirm which controller among the controllers within the vehicle has turned the vehicle communication network to the alive state again.

For a microcontroller unit that is able to capture a trigger signal of a controller through the vehicle communication network, when the microcontroller unit is switching from the sleep mode to the wake-up mode, the microcontroller unit requires a time to switch, so that the capturing of the trigger signal of the controller that wakes-up the vehicle communication network is impossible.

SUMMARY

The present disclosure relates to a system for identifying a controller causing an electrical discharge of a vehicle. Particular embodiments relate to a system that is able to identify a controller causing an electrical discharge of a vehicle power source.

Accordingly, embodiments of the present disclosure have been made keeping in mind problems occurring in the related art, and embodiments of the present disclosure provide a system for identifying a controller causing an electrical discharge of a vehicle. When a vehicle communication network is in a sleep mode and then the vehicle communication network is woken up with an initial communication message by an arbitrary controller among controllers within a vehicle, identification information of the controller that transmitted the initial communication message is stored in a microcontroller unit (MCU). Thus, the system according to embodiments of the present disclosure identifies the controller causing an electrical discharge of a vehicle.

One embodiment of the present disclosure provides a system for identifying a controller causing an electrical discharge of a vehicle, the system including a signal delay unit communicatively connected to controllers within the vehicle and configured to transmit a wake-up trigger signal after a predetermined first time passes when the wake-up trigger signal is input from a first controller among the controllers, and a microcontroller unit configured to enter into a wake-up mode after the first time passes when the microcontroller unit is in a sleep mode and the wake-up trigger signal is received through a single-channel transceiver connected to the first controller, and configured to store an identification (ID) of the first controller when the wake-up trigger signal is received from the signal delay unit.

The first time may be a time required for the microcontroller unit to be switched from the sleep mode to the wake-up mode after the microcontroller unit receives the wake-up trigger signal.

According to an embodiment of the present disclosure, the system for identifying a controller causing an electrical discharge of a vehicle may have the following specific features.

The signal delay unit is connected to the controllers within the vehicle through a switch unit, and the switch unit is turned on by the microcontroller unit so that the wake-up trigger signal is selectively transmittable to the signal delay unit.

The microcontroller unit is configured to turn on the switch unit immediately before being switched to the sleep mode. Here, the switch unit may include a latching relay that holds an on-mode until the switch unit is switched to an off-mode. In addition, the microcontroller unit turns off the switch unit when the microcontroller unit is switched to the wake-up mode.

The signal delay unit is connected to the microcontroller unit through a multi-channel transceiver, and the multi-channel transceiver is configured to convert the wake-up trigger signal received from the signal delay unit into a digital signal so as to transmit the converted signal to the microcontroller unit. The multi-channel transceiver may include a plurality of communication channels that are individually connected to the controllers within the vehicle through the signal delay unit.

The system according to embodiments of the present disclosure may further include an intelligent battery sensor configured to detect a wake-up time value of the microcontroller unit.

When the microcontroller unit receives the wake-up trigger signal from a multi-channel transceiver and receives the wake-up time value of the microcontroller unit from the intelligent battery sensor, the microcontroller unit records the wake-up time value to an internal memory in conjunction with the ID of the first controller. The wake-up time value may be an elapsed time that is from a time when the microcontroller unit enters into the sleep mode to a time when the microcontroller unit is switched to the wake-up mode.

The first controller is any one of the controllers that transmit and receive signals in a vehicle communication network through the microcontroller unit, and is a controller woken up by abnormal operations when the vehicle communication network is in an inactive state.

According to embodiments of the present disclosure, when the vehicle communication network is in the inactive state, a controller causing the wake-up may be identified by checking identification information of a controller that is woken up abnormally from a memory of the microcontroller unit. Accordingly, when analyzing a cause of an electrical discharge of a vehicle, the cause of an electrical discharge may be easily analyzed by using the identification information of a controller. As a result, the Man-Hours (M/H) which are required when analyzing the cause of an electrical discharge of a vehicle may be reduced.

DETAILED DESCRIPTION OF ILLUSTRATIVE EMBODIMENTS

Hereinafter, exemplary embodiments of the present disclosure will be described in detail with reference to the accompanying drawings. Moreover, it is to be understood that all matters herein set forth in the accompanying drawings are to be interpreted as illustrative and may be in different forms from those actually implemented.

Figure 1:
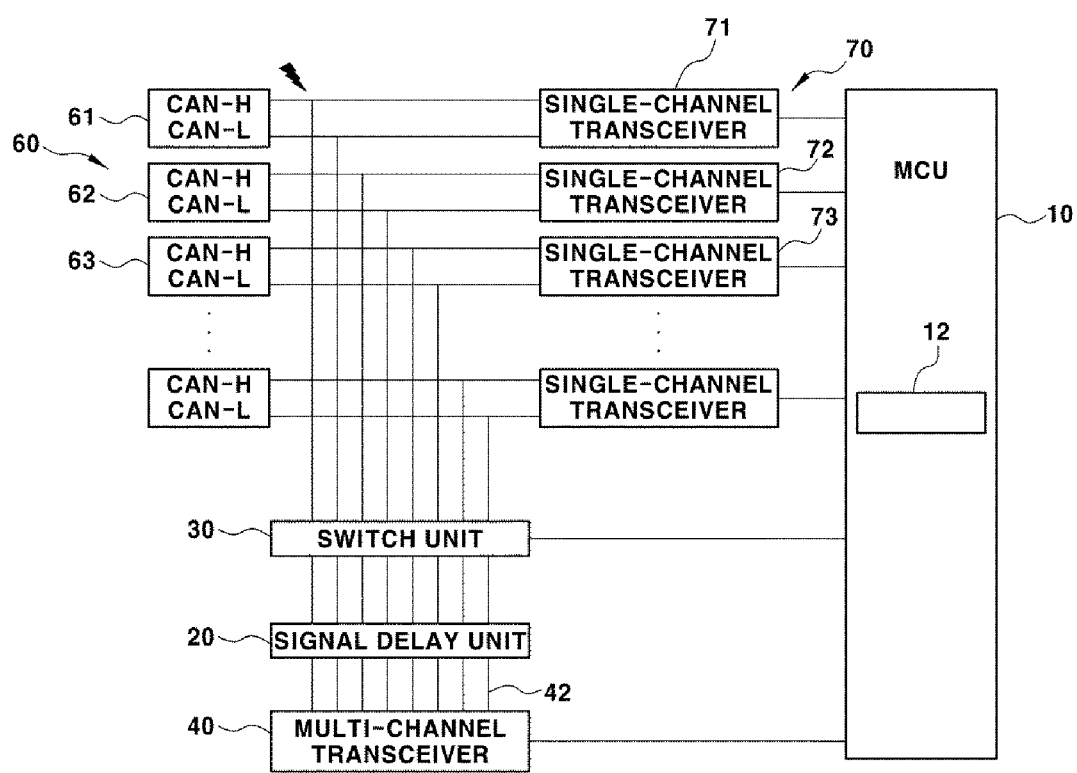
FIG. 1 is a view illustrating a configuration of a system for identifying a controller causing an electrical discharge of a vehicle according to an embodiment of the present disclosure.

FIG. 1 is a view illustrating a configuration of a system for identifying a controller causing an electrical discharge of a vehicle according to an embodiment of the present disclosure.

Generally, a vehicle is mounted with various electronic control components including body electronics, multimedia devices, chassis electronics, and a powertrain. Therefore, various controllers are mounted within a vehicle to control the operations of these electronic control components.

The controllers within the vehicle perform cooperative control by transmitting and receiving signals through a vehicle communication network. A Controller Area Network (CAN) is a representative communication network used for communication between the controllers within the vehicle.

A system for identifying a controller causing an electrical discharge of a vehicle according to embodiments of the present disclosure is for identifying a controller that wakes-up the vehicle communication network which has entered into a sleep mode. As illustrated in FIG. 1, the system according to embodiments of the present disclosure includes a microcontroller unit (MCU) 10, a signal delay unit 20, and a multi-channel transceiver 40.

The MCU 10 is connected to the vehicle communication network and functions as a gateway, such that the controllers within the vehicle are interconnected to each other through the MCU 10 and communicate with each other.

The MCU 10 may transfer a signal received from any one of the controllers within the vehicle to another controller. For example, the MCU 10 may transfer a signal received from a second controller among the controllers within the vehicle to a third controller.

As illustrated in FIG. 1, the MCU 10 is simultaneously connected to a plurality of controllers 60 within the vehicle. Among a plurality of controllers 60, a controller marked with the reference numeral of 62 may be the second controller 62, and a controller marked with the reference numeral of 63 may be the third controller 63.

Here, the second controller 62 and the third controller 63 are each any one of the controllers among the controllers 60 within the vehicle and are each also a different controller.

The second controller 62 may be communicatively connected to the MCU 10 through a second single-channel transceiver 72, and the third controller 63 may be communicatively connected to the MCU 10 through a third single-channel transceiver 73.

The second single-channel transceiver 72 functions to convert a signal, which is a signal transmitted from the second controller 62 and a signal the MCU 10 receives from the second controller 62 to be transmitted to a predetermined controller, into a digital signal.

The third single-channel transceiver 73 functions to convert a signal, which is a signal transmitted from the third controller 63 and a signal the MCU 10 receives from the third controller 63 to be transmitted to a predetermined controller, into a digital signal.

The controllers 60 within the vehicle may transmit data to the MCU 10 through single-channel transceivers 70 individually connected to each of the controllers 60. Therefore, the MCU 10 may transmit a signal from the second controller 62 received through the second single-channel transceiver 72 to the third controller 63 through the third single-channel transceiver 73.

When the MCU 10 enters into the sleep mode due to a power supply from a battery being suspended, the MCU 10 is woken up by an initial signal transmitted from the controller 60 and is switched to the alive state. Here, the initial signal refers to a first signal which the MCU 10 receives after the MCU 10 has entered into the sleep mode.

However, the MCU 10, which has entered into the sleep mode, requires hundreds of milliseconds to be switched to the wake-up mode by the signal of the controller 60. This is because, in order for the MCU 10 to enter into the wake-up mode, an initialization task such as for setting up a port to input and output a signal and so on is required to be performed.

Therefore, the system for identifying a controller causing an electrical discharge of a vehicle uses the signal delay unit 20, so that a signal from a controller causing the wake-up of the MCU 10 (i.e., a wake-up trigger signal) is input again after the MCU 10 is woken up.

The signal delay unit 20 is configured to delay the wake-up trigger signal from any one of the controllers among the controllers 60 within the vehicle for a predetermined time, such that, when the vehicle communication network is in an inactive state and the MCU 10 is in the sleep mode, the wake-up trigger signal is transmitted to the MCU 10 after the predetermined time.

Here, a controller that transmits the wake-up trigger signal is a first controller 61. The first controller 61 is one of the controllers 60 within the vehicle that transmits and receives signals through the MCU 10 in the vehicle communication network, and is a controller that has been woken up due to abnormal operations when the vehicle communication network is in the inactive state.

More specifically, the first controller 61 is a controller that has been woken up by abnormal operations after all of the controllers 60 within the vehicle have entered into the sleep mode and the vehicle communication network has switched to the inactive state. The first controller 61 may be a different controller from the second controller 62 and the third controller 63.

In addition, when the vehicle communication network is in the active state and the MCU 10 is in the wake-up mode, the single-channel transceiver 71 that transmits the signal from the first controller 61 to the MCU 10 is the first single-channel transceiver 71. The first single-channel transceiver 71 is one of the single-channel transceivers 70 connected between the controllers 60 within the vehicle and the MCU 10.

In addition, the wake-up trigger signal may be a trigger signal that switches the MCU 10 into the wake-up mode and switches the vehicle communication network into the active state.

As illustrated in FIG. 1, the signal delay unit 20 is communicatively connected between the controllers 60 within the vehicle and the MCU 10. The signal delay unit 20 may be connected in parallel with each of the single-channel transceivers 70 in the communication network of the controllers 60.

In other words, in order for the signal delay unit 20 to receive the wake-up trigger signal when the wake-up trigger signal is transferred to the MCU 10 through the first single-channel transceiver 71, the signal delay unit 20 is connected in parallel to the first single-channel transceiver 71, thereby receiving the wake-up trigger signal. The signal delay unit 20 may have a plurality of input ports and communication channels that are individually accessible for each of the controllers 60 that communicates through the MCU 10.

More specifically, the signal delay unit 20 may be connected in parallel with a plurality of single-channel transceivers 70 in the communication channels that are connected to output ports of the controllers 60. The input ports of the signal delay unit 20 are connected to the communication channels that are located between the output ports of the controllers 60 and the input ports of the single-channel transceivers 70, thus allowing the input of the wake-up trigger signal to be received.

Therefore, when the wake-up trigger signal is generated from the first controller 61, the wake-up trigger signal is transmitted to the MCU 10 through the first single-channel transceiver 71, and is input to the signal delay unit 20 simultaneously.

When the wake-up trigger signal is input to the signal delay unit 20, the signal delay unit 20 is configured to delay the transmission of the wake-up trigger signal for a predetermined time until the MCU 10 is woken up.

In other words, when the signal delay unit 20 receives the wake-up trigger signal from the first controller 61, the signal delay unit 20 will transmit the wake-up trigger signal to the MCU 10 after a first time ti is elapsed. Here, the first time ti may be set to a predetermined time. More specifically, the first time ti may be determined as a reboot time that is from a time when the MCU 10 receives the wake-up trigger signal to a time when the MCU 10 wakes up.

Figure 2:
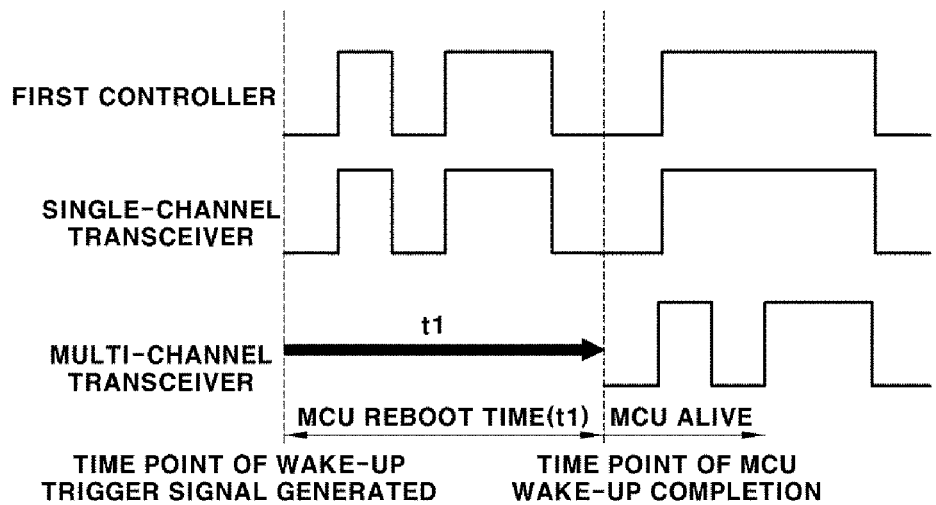
FIG. 2 is a view illustrating the principle of identification of a controller causing a wake-up by using the system for identifying a controller causing an electrical discharge of a vehicle according to an embodiment of the present disclosure.

Accordingly, as illustrated in FIG. 2, when the first controller 61 transmits the wake-up trigger signal, the first single-channel transceiver 71 transmits the wake-up trigger signal to the MCU 10 without delay of the transmission, and the signal delay unit 20 transmits the wake-up trigger signal to the multi-channel transceiver 40 with a delay of a predetermined time. The wake-up trigger signal input to the signal delay unit 20 may be transmitted to the MCU 10 through the multi-channel transceiver 40.

Figure 3:
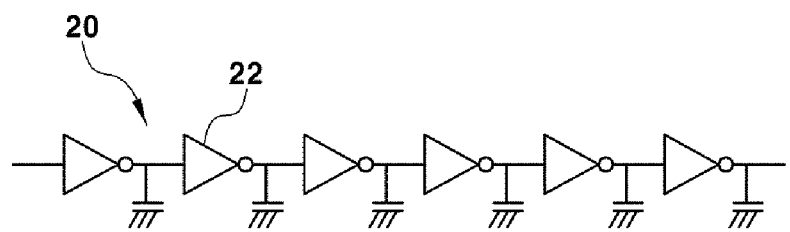
FIG. 3 is a view illustrating a circuit configuration of a signal delay unit according to an embodiment of the present disclosure.
Figure 4:
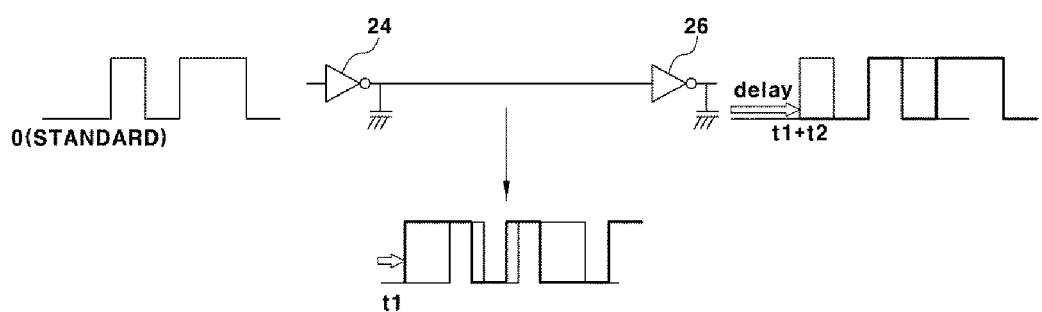
FIG. 4 is a view illustrating a signal transmission process according to a circuit configuration of the signal delay unit according to an embodiment of the present disclosure.

FIG. 3 is a view illustrating a circuit configuration of the signal delay unit according to an embodiment of the present disclosure, and FIG. 4 is a schematic view illustrating a signal transmission process according to the circuit configuration of the signal delay unit.

As illustrated in FIG. 3, the signal delay unit 20 may be configured with a delay circuit that delays the transmission of the wake-up trigger signal for a predetermined time. In other words, the signal delay unit 20 may be configured to delay and transmit the wake-up trigger signal that is for switching the vehicle communication network to the active state for the first time T1.

More specifically, the delay circuit of the signal delay unit 20 may be configured with an inverter that inverts a phase of an input signal and delays transmission of a signal simultaneously. As illustrated in FIG. 4, when the input signal passes through the inverter, the phase of the signal is inverted and the transmission of the signal is delayed, which is known as a propagation delay. When the input signal passes through a first inverter 24, signal transmission is delayed up to a second time T2, and then when the input signal passes a second inverter 26, the signal transmission is delayed up to a third time T3.

Therefore, when a signal initially input to the first inverter 24 passes through the first inverter 24 and the second inverter 26, the signal transmission will be delayed for a fourth time T2+T3 without phase inversion. The fourth time T2+T3 is the sum of the second time T2 and the third time T3.

The signal delay unit 20 may be configured with an even number of inverters and, by controlling the numbers of inverters, the signal delay unit 20 may be designed to delay the signal transmission for the desired amount of time.

For example, as illustrated in FIG. 3, the signal delay unit 20 may be configured in series with six inverters 22. Assuming that one inverter delays the signal transmission for a fifth time T5, the signal delay unit 20 may delay the transmission of the wake-up trigger signal for as much as six times the fifth time T5. Therefore, when the reboot time of the MCU 10 is six ms, the signal delay unit 20 may be configured by selecting an inverter element that may delay the signal transmission for one ms and by connecting the six inverter elements in series.

On the other hand, to prevent the signal delay unit 20 from connecting to the controller 60 at all times, as illustrated in FIG. 1, it is recommended to place a switch unit 30 between the controller 60 and the signal delay unit 20. That is, it is recommended that the signal delay unit 20 be connected through the switch unit 30 to the controllers 60 within the vehicle.

The switch unit 30 may be configured to determine whether to transmit a signal between the controller 60 and the signal delay unit 20, and may be configured to be controlled by the MCU 10.

Figure 5:
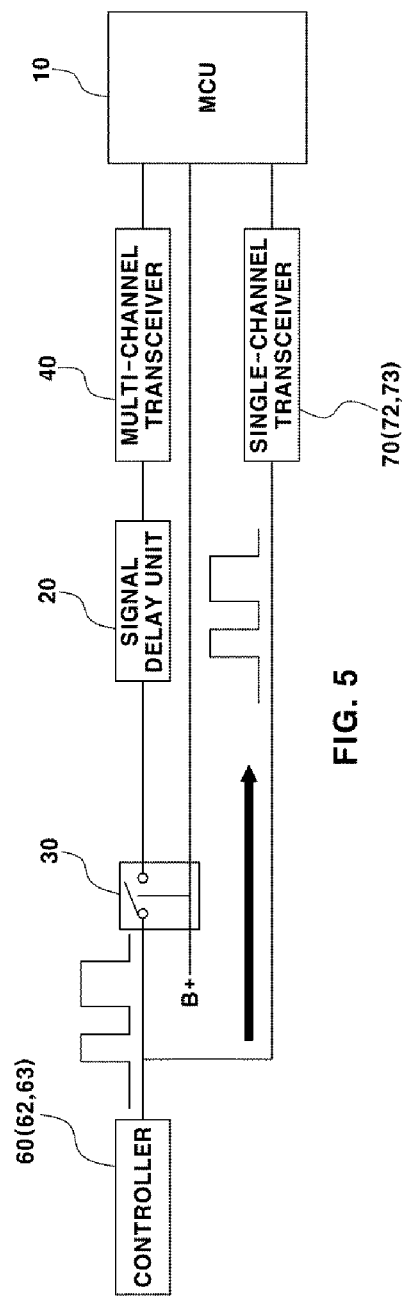
FIG. 5 is a view illustrating a signal transfer path between a controller and a microcontroller unit according to an embodiment of the present disclosure when a switch unit is in an off-mode.
Figure 6:
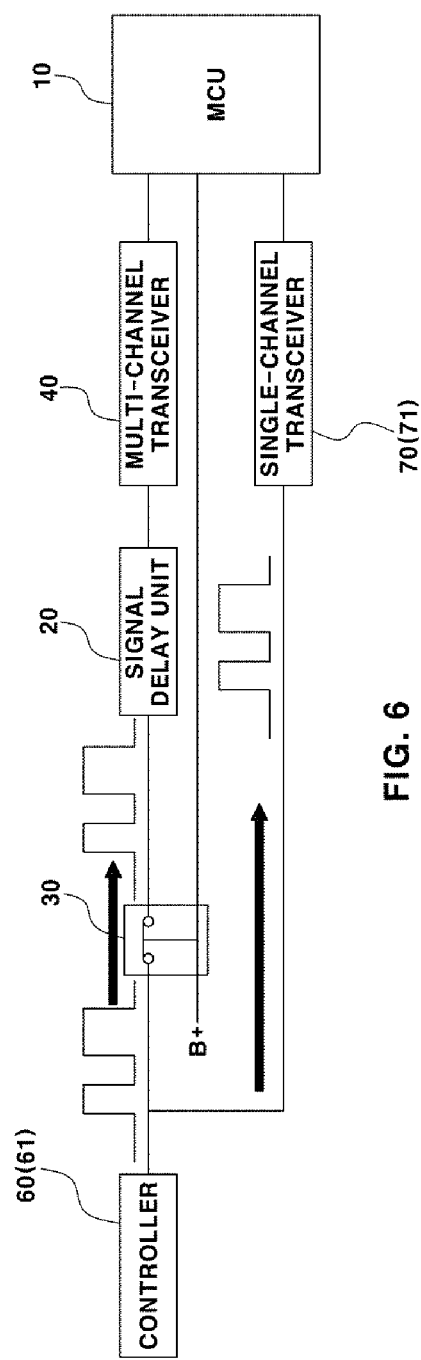
FIG. 6 is a view illustrating a signal transfer path between a controller and a microcontroller unit according to an embodiment of the present disclosure when the switch unit is in an on-mode.

FIG. 5 is a view illustrating a signal transfer path between the controller and the MCU when the switch unit is in the off-mode, and FIG. 6 is a view illustrating a signal transfer path between the controller and the MCU when the switch unit is in the on-mode.

As illustrated in FIG. 5, the switch unit 30 may be configured with a latching relay. When the MCU 10 is in a normal state, that is, when the MCU 10 is not entering into the sleep mode, that is, when the MCU 10 is in the wake-up mode, the switch unit 30 holds the off mode.

When the MCU 10 is powered off and the MCU 10 enters into the sleep mode, as illustrated in FIG. 6, the switch unit 30 will be turned on by the MCU 10 and operate.

When the switch unit 30 is switched to the on-mode, the wake-up trigger signal is able to be transmitted to the signal delay unit 20. In other words, when the switch unit 30 is switched to the on-mode, it allows the transmission of the signal between the controllers 60 within the vehicle and the signal delay unit 20.

The switch unit 30 is configured with the latching relay which is to be turned on when the MCU 10 enters into the sleep mode, and is to be turned off when the MCU 10 enters into the wake-up mode. Thus, after the MCU 10 enters into the wake-up mode, the wake-up trigger signal which is generated at an arbitrary time may be detected and be selectively transmitted to the signal delay unit 20.

The switch unit 30 is turned on or turned off by a control signal of the MCU 10. More specifically, the MCU 10 turns on the switch unit 30 immediately before entering into the sleep mode when the power is off, and the MCU 10 turns off the switch unit 30 immediately after entering into the wake-up mode.

Here, the switch unit 30 may be connected to a battery B+ and may be turned on by a current supplied by the battery B+. The battery B+ may be the power source of the MCU 10.

The switch unit 30 is configured with a permanent magnet-used latching relay to provide a magnetic force that maintains an operation state of a contact point, such that once the switch unit 30 is switched to the on-mode, the on-mode may transmit a signal to the signal delay unit 20 until the switch unit 30 is switched off by the MCU 10.

When the MCU 10 is woken up by the wake-up trigger signal, as illustrated in FIG. 5, the switch unit 30 is turned off by the MCU 10, thereby stopping the operation of transmitting the signal of the controller 60 to the signal delay unit 20.

Therefore, when the MCU 10 is in the wake-up state, the signal is transmitted from the controller 60 through the single-channel transceiver 70, and at the same time a duplicate transmission of the signal transmitted through the signal delay unit 20 to the MCU 10 may be prevented.

Also, as shown in FIG. 1, the signal delay unit 20 may be connected to the MCU 10 through the multi-channel transceiver 40. The signal delay unit 20 is connected between the controller 60 and the multi-channel transceiver 40, and transmits the wake-up trigger signal received through the switch unit 30 to the MCU 10 through the multi-channel transceiver 40.

The multi-channel transceiver 40 connects between the signal delay unit 20 and the MCU 10, and when the multi-channel transceiver 40 receives the wake-up trigger signal from the signal delay unit 20, the multi-channel transceiver 40 transmits the wake-up trigger signal to the MCU 10.

The multi-channel transceiver 40 is configured to have a plurality of communication channels, such that the multi-channel transceiver 40 may receive the wake-up trigger signal from an arbitrary controller among the controllers 60 within the vehicle (i.e., the first controller) through different channels.

For this purpose, the multi-channel transceiver 40 may have communication channels corresponding to the number of controllers connected through the single-channel transceiver 70 on the MCU 10. In other words, the multi-channel transceiver 40 may be configured to have a plurality of communication channels that are connected individually to the controllers 60 within the vehicle.

The multi-channel transceiver 40 will be woken up when the multi-channel transceiver 40 receives the wake-up trigger signal from the signal delay unit 20, and after entering into the wake-up mode, the multi-channel transceiver 40 transmits the wake-up trigger signal to the MCU 10.

When the MCU 10 receives the wake-up trigger signal while the MCU 10 is in the sleep mode, after the first time T1 is elapsed from the time when the MCU 10 receives the wake-up trigger signal, the MCU 10 will be woken up and the reboot will be completed such that the MCU 10 enters the alive state.

When the MCU 10 receives a signal from the controller while the MCU 10 is in the alive state which is that reboot is completed, the MCU 10 uses the information included in the signal and is able to identify the controller that transmitted the signal.

In order to identify the controller that initially transmitted a signal to wake-up the MCU 10 when the vehicle communication network is in the inactive state, the MCU 10 records the identification of the controller that transmitted the wake-up trigger signal to an internal memory 12 when the MCU 10 receives the wake-up trigger signal from the multi-channel transceiver 40.

In other words, when the MCU 10 receives the signal of the first controller 61 by the multi-channel transceiver 40 immediately after the wake-up is completed, the MCU 10 records and stores the ID, which is the identification symbol of the first controller 61 that transmitted the wake-up trigger signal, in the internal memory 12.

The multi-channel transceiver 40 converts the analog signal (that is, the wake-up trigger signal) received from the signal delay unit 20 into the digital signal and transmits the converted signal to the MCU 10.

If the first controller 61, which transmits the wake-up trigger signal, is a controller for a body electronics and for a multimedia device that uses the Network Management (NM) message to communicate, the multi-channel transceiver 40 converts the NM message of the first controller 61 into a digital signal and transmits the converted signal to the MCU 10 together with the wake-up trigger signal.

The NM message is a message that includes the identification information of the controller that transmits the message, such that the MCU 10 may identify the first controller 61 that transmitted the wake-up trigger signal from other controllers by using the NM message.

Therefore, the MCU uses a message that includes the identification information with the NM message, such that the MCU 10 may identify which controllers 60 within the vehicle transmit the wake-up trigger signal.

In addition, if the first controller 61, which transmits a wake-up trigger signal, is a controller that is not using an NM message and an NM network such as the controller of the chassis electronics and a powertrain, the multi-channel transceiver 40 transmits the highest identifier information of each controller together with the wake-up trigger signal to the MCU 10 to identify the controller.

Figure 7:
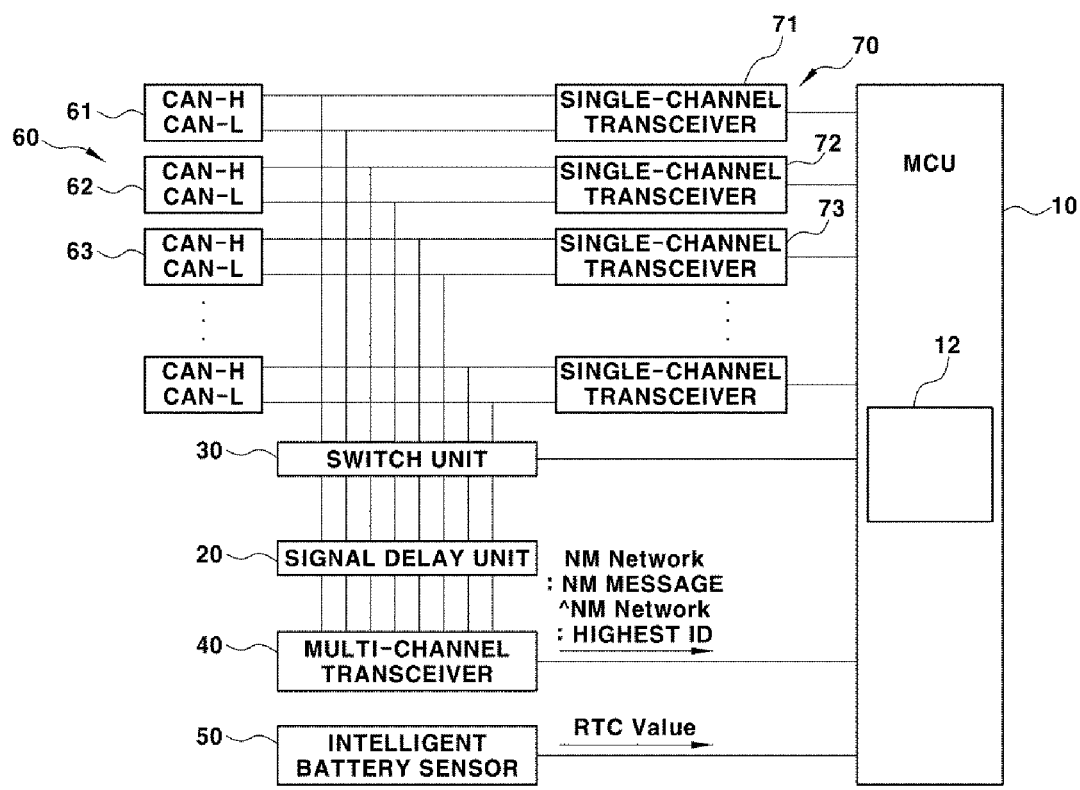
FIG. 7 is a view illustrating a configuration of a system for identifying a controller causing a discharge of a vehicle according to another embodiment of the present disclosure.

FIG. 7 is a view illustrating the configuration of the system for identifying a controller causing an electrical discharge of a vehicle according to another embodiment of the present disclosure.

As illustrated in FIG. 7, the system according to the present disclosure may further include an Intelligent Battery Sensor (IBS) 50.

The IBS 50 is configured to measure the voltage, current, and so on of the battery that is power source of the MCU 10, and the IBS 50 may detect a wake-up time value of the MCU 10 by using a built-in Real-Time Counter (RTC).

The wake-up time value may indicate an elapsed time from a time when the MCU 10 enters into the sleep mode to a time when the MCU 10 switches to the wake-up mode. In other words, the wake-up time value may indicate a switched time from the time when the MCU 10 enters into the sleep mode to the time when the MCU 10 enters into the wake-up mode.

The IBS 50, by using the RTC, may detect the time that is from the time when the MCU 10 enters into the sleep mode where the battery is not discharged to the time when the MCU 10 enters the wake-up mode where the battery is discharged.

When the MCU 10 receives the wake-up time value from the IBS 50, the MCU 10 matches the wake-up time value with the ID of the first controller 61 and stores it in the internal memory 12.

In other words, when the MCU 10 receives the wake-up trigger signal from the first controller 61 through the multi-channel transceiver 40 and receives the wake-up time value from the IBS 50, the MCU 10 may record the wake-up time value to the internal memory 12 in conjunction with the ID of the first controller 61. The IBS 50 may transmit the wake-up time value to the MCU 10 through a Local Interconnect Network (LIN) communication.

By recording the identification of the first controller 61 and the wake-up time value of the MCU 10 to the internal memory 12 of the MCU 10, so that when the vehicle communication network is normally terminated and is in the inactive state, the controller woken up by abnormal operations may be identified. Later, when analyzing the cause of an electrical discharge, the identification and wake-up time value information that are stored in the internal memory 12 may be used to facilitate the analysis of the cause of the electrical discharge.

In other words, if the MCU 10 enters into the sleep mode and an initial communication message from an arbitrary controller among the controllers 60 within the vehicle causes the MCU 10 to wake up and the vehicle communication network to enter into the active state, by recording the identification ID of the controller that initially transmits the communication message to the MCU 10, the controller causing the vehicle communication network to be in the alive state may be identified later, and is useful for further analysis of a cause of an electrical discharge of the vehicle by the information stored in the MCU 10 (that is, the identification of the controller and the wake-up time value information).

Generally, when the MCU 10 is entering into the wake-up mode from the sleep mode, that is, before the MCU 10 is completely rebooted, it is impossible for the MCU 10 to capture the controller identification information included in the wake-up trigger signal.

On the other hand, when the switch unit 30, the signal delay unit 20, and the multi-channel transceiver 40 are modularized and configured as a portable device, only connecting the portable device to a connector connected to the controller 60, the MCU 10, and the vehicle power source B+ will find a wake-up trigger controller among the controllers 60 within the vehicle.

Figure 8:
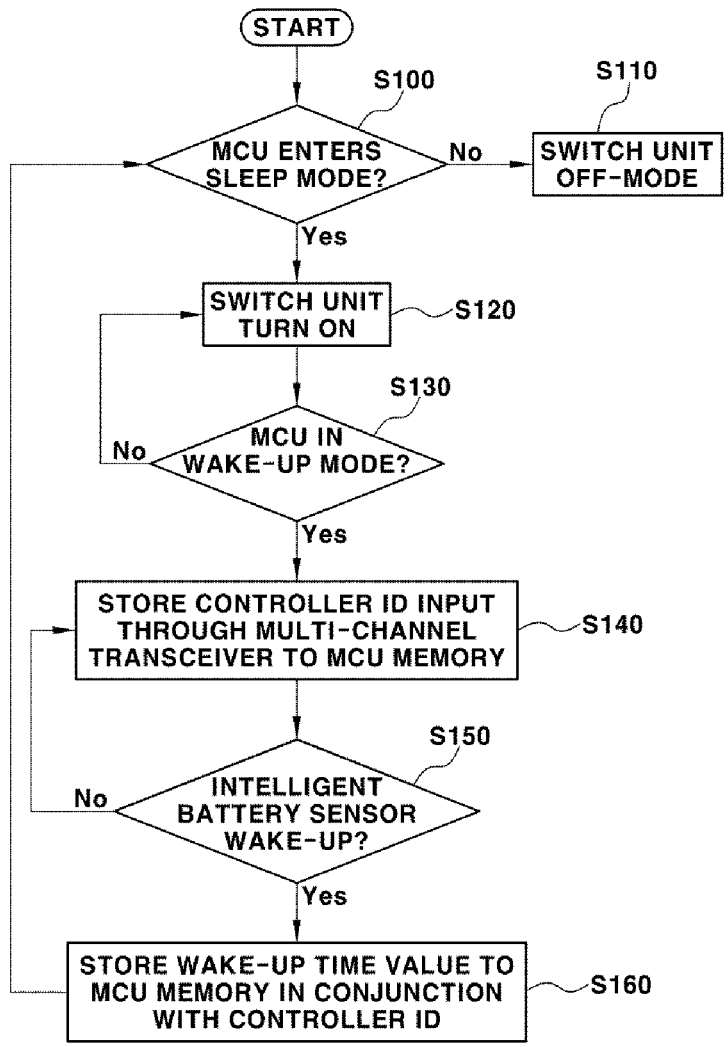
FIG. 8 is a flowchart illustrating a method of identifying a controller causing a wake-up by using a system for identifying a controller causing an electrical discharge of a vehicle according to embodiments of the present disclosure.

FIG. 8 is a flowchart illustrating a method of identifying a controller causing a wake-up by using a system for identifying a controller causing an electrical discharge of a vehicle according to embodiments of the present disclosure.

As illustrated in FIG. 8, the power supply to the MCU 10 is stopped and the method determines whether the MCU 10 is entering the sleep mode (S100).

If the MCU 10 is not entering into the sleep mode (No at S100), the switch unit 30 will remain in the off-mode (S110).

When the MCU 10 enters into the sleep mode after the communication between the controllers 60 ends normally (Yes at S100), the MCU 10 switches the switch unit 30 to the on-mode immediately before entering into the sleep mode (S120).

Thus, the signal delay unit 20 is communicatively connected to the controllers 60 through the switch unit 30, and is in the state that may receive the wake-up trigger signal from the controllers 60.

Next, whether the MCU 10 is switching to the wake-up mode is determined (S130).

If the MCU 10 is not switching into the wake-up mode and remains in the sleep mode (No at S130), the switch unit 30 holds the on-mode to wait for the input of the wake-up trigger signal.

When the MCU 10 switches to the wake-up mode (Yes at S130), the MCU 10 stores the controller identification information of the wake-up trigger signal that is input through the multi-channel transceiver 40 (i.e., the ID of the first controller 61) to the internal memory 12 (S140).

Next, whether the communication network of the IBS 50 is woken up is determined (S150). If the communication network of the IBS 50 is not woken up (No at S150), the system waits for the IBS 50 to be woken up (i.e., returns to S140).

When the communication network of the IBS 50 is woken up (Yes at S150), the MCU 10 receives a wake-up time value through the IBS 50 and matches the ID of the first controller 61 and stores it in the internal memory 12 (S160).

The ID information of the first controller 61 stored in the internal memory 12 of the MCU 10 and the wake-up time value of the MCU 10 may be retrieved by connecting a discharge cause diagnostic device to the MCU 10, which may be displayed to the user through a display of the diagnostic device.

Although the present disclosure has been described with reference to exemplary embodiments, the exemplary embodiments are presented to describe the technical spirit of the present disclosure only for illustrative purposes and those skilled in the art will appreciate that various modifications and changes are possible, without departing from the scope and spirit of the present disclosure. Therefore, it should be understood that the protection scope of the present disclosure is defined by the accompanying claims rather than the description which is presented above. Moreover, the present disclosure is intended to cover not only the exemplary embodiments but also various alternatives, modifications, equivalents and other embodiments that may be included within the spirit and scope of the embodiments as defined by the appended claims.

What is claimed is:

1. A system for identifying a controller causing an electrical discharge of a vehicle, the system comprising:
a signal delay unit communicatively connected to controllers within the vehicle and configured to transmit a wake-up trigger signal after a predetermined first time passes when the wake-up trigger signal is input from a first controller among the controllers; and
a microcontroller unit configured to:
enter into a wake-up mode after the first time passes when the microcontroller unit is in a sleep mode and the wake-up trigger signal is received through a single-channel transceiver connected to the first controller; and
store an identification of the first controller when the wake-up trigger signal is received from the signal delay unit,
wherein the signal delay unit is connected to the controllers within the vehicle through a switch unit, and when the switch unit is turned on by the microcontroller unit, the wake-up trigger signal is selectively transmittable to the signal delay unit.

2. The system of claim 1, wherein the microcontroller unit is configured to turn on the switch unit immediately before being switched to the sleep mode.

3. The system of claim 1, wherein the switch unit is a latching relay configured to hold an on-mode until the switch unit is switched to an off-mode.

4. The system of claim 1, wherein the microcontroller unit is configured to turn off the switch unit when the microcontroller unit is switched to the wake-up mode.

5. The system of claim 4, wherein the switch unit is configured to hold an off-mode when the microcontroller unit is in the wake-up mode.

6. The system of claim 4, wherein, when the switch unit is turned off, the switch unit is configured to stop a signal transmission operation that transmits signals from the first controller to the signal delay unit.

7. The system of claim 1, wherein the first controller is any one of the controllers configured to transmit and receive signals in a vehicle communication network through the microcontroller unit, and is configured to be woken up by abnormal operations when the vehicle communication network is in an inactive state.

8. The system of claim 1, wherein the first time is a time required for the microcontroller unit to be switched from the sleep mode to the wake-up mode after the microcontroller unit receives the wake-up trigger signal.

9. The system of claim 1, wherein the wake-up trigger signal is an initial signal configured to be transmitted by the first controller when a vehicle communication network is in an inactive state and the microcontroller unit is in the sleep mode.

10. The system of claim 9, wherein the wake-up trigger signal is a signal that is configured to switch a mode of the microcontroller unit to the wake-up mode and switch a state of the vehicle communication network to an active state.

11. The system of claim 1, further comprising a plurality of single-channel transceivers to which the controllers within the vehicle are individually connected, wherein the controllers within the vehicle are communicatively connected to the microcontroller unit through the single-channel transceivers that are individually connected to the controllers.

12. The system of claim 1, wherein the signal delay unit comprises an even number of inverters connected in series.

13. A system for identifying a controller causing an electrical discharge of a vehicle, the system comprising:
a signal delay unit communicatively connected to controllers within the vehicle and configured to transmit a wake-up trigger signal after a predetermined first time passes when the wake-up trigger signal is input from a first controller among the controllers, wherein the signal delay unit is connected to the controllers within the vehicle through a switch unit, and when the switch unit is turned on by the microcontroller unit, the wake-up trigger signal is selectively transmittable to the signal delay unit;
a microcontroller unit configured to:
enter into a wake-up mode after the first time passes when the microcontroller unit is in a sleep mode and the wake-up trigger signal is received through a single-channel transceiver connected to the first controller; and
store an identification of the first controller when the wake-up trigger signal is received from the signal delay unit; and
a multi-channel transceiver connecting the signal delay unit to the microcontroller unit, wherein the multi-channel transceiver is configured to convert the wake-up trigger signal received from the signal delay unit into a digital signal and to transmit the converted signal to the microcontroller unit.

14. The system of claim 13, wherein the multi-channel transceiver includes a plurality of communication channels that are individually connected to the controllers within the vehicle through the signal delay unit.

15. The system of claim 13, wherein the multi-channel transceiver is configured to transmit identification information of the first controller to the microcontroller unit together with the wake-up trigger signal.

16. A system for identifying a controller causing an electrical discharge of a vehicle, the system comprising:
a signal delay unit communicatively connected to controllers within the vehicle and configured to transmit a wake-up trigger signal after a predetermined first time passes when the wake-up trigger signal is input from a first controller among the controllers, wherein the signal delay unit is connected to the controller within the vehicle through a switch unit, and when the switch unit is turned on by the microcontroller unit, the wake-up trigger signal is selectively transmittable to the signal delay unit;
a microcontroller unit configured to:
enter into a wake-up mode after the first time passes when the microcontroller unit is in a sleep mode and the wake-up trigger signal is received through a single-channel; transceiver connected to the first controller; and
store an identification of the first controller when the wake-up trigger signal is received from the signal delay unit; and
an intelligent battery sensor configured to detect a wake-up time value of the microcontroller unit.

17. The system of claim 16, wherein the microcontroller unit is configured to record the wake-up time value to an internal memory in conjunction with the identification of the first controller when the microcontroller unit receives the wake-up trigger signal from a multi-channel transceiver and receives the wake-up time value of the microcontroller unit from the intelligent battery sensor.

18. The system of claim 16, wherein the wake-up time value is an elapsed time that is from a time when the microcontroller unit entered into the sleep mode to a time when the microcontroller unit switched to the wake-up mode.

19. The system of claim 16, wherein the intelligent battery sensor is configured to detect the wake-up time value of the microcontroller unit by using a real-time counter built into the intelligent battery sensor.

20. The system of claim 16, wherein the multi-channel transceiver includes a plurality of communication channels that are individually connected to the controllers within the vehicle through the signal delay unit.

\* \* \* \* \*